United States Patent [19]
Abe et al.

[11] Patent Number: 5,349,136
[45] Date of Patent: Sep. 20, 1994

[54] MOLD TOOL ASSEMBLY

[75] Inventors: Mitsuhiro Abe, Hirakata; Nakanishi Itsuto, Neyagawa; Ariyoshi Hideho; Asao Iguchi, both of Hirakata, all of Japan

[73] Assignee: Matsushita Electric Industrial Co., Ltd., Osaka, Japan

[21] Appl. No.: 17,418

[22] Filed: Feb. 10, 1993

Related U.S. Application Data

[60] Continuation-in-part of Ser. No. 841,764, Feb. 28, 1992, abandoned, which is a division of Ser. No. 561,907, Jul. 31, 1990, abandoned.

Foreign Application Priority Data

Aug. 2, 1989 [JP] Japan ................................ 1-201925

[51] Int. Cl.$^5$ ...................... H01L 23/28; B22D 41/08
[52] U.S. Cl. ........................ 174/52.2; 249/105; 249/110
[58] Field of Search ............... 174/52.2, 52.3, 52.4; 29/841, 848–849, 855–856; 437/211–213, 217–219; 264/271.1, 272.11, 272.12, 272.13; 257/787, 666, 667, 670, 671; 249/95, 96, 97, 110, 105

[56] References Cited

U.S. PATENT DOCUMENTS

| | | | |
|---|---|---|---|
| 4,707,725 | 11/1987 | Ito | 357/72 |
| 4,788,583 | 11/1988 | Kawahara et al. | 357/72 |
| 4,888,307 | 12/1989 | Spairisano et al. | 437/216 |
| 4,933,744 | 6/1990 | Segawa et al. | 357/72 |
| 4,959,505 | 9/1990 | Ott | 174/52.2 |
| 4,974,057 | 11/1990 | Tazima | 357/72 |
| 5,018,003 | 5/1991 | Yasunaga et al. | 357/72 |
| 5,049,977 | 9/1991 | Sako | 357/72 |

*Primary Examiner*—Leo P. Picard
*Assistant Examiner*—Bot Ledynh
*Attorney, Agent, or Firm*—Wenderoth, Lind & Ponack

[57] ABSTRACT

A mold tool for forming an electronic component having a semiconductor chip sealed on a supporting member by a resin-molded package, includes an upper mold having an upper cavity and a lower mold having a lower cavity, the package being molded in the cavities. Upper and lower gates are arranged at opposing surfaces of the molds and symmetrically formed with respect to a parting face of the mold tool to connect with the cavities. A method for forming the component includes the steps of inserting the supporting member with the chip in the cavities of the molds of the mold tool, clamping the molds, injecting molten resin into the cavities of the clamped molds through the upper and lower gates, cooling the molten resin in the cavities, and separating the molds from each other and removing the component from the cavities. The supporting member has a recess where the chip is located, and the recess has such a depth that a distance between an upper surface of the chip located in the recess and an upper surface of the package is substantially equal to a distance between a lower surface of a portion where the recess is formed and a lower surface of the package. A lead frame is one of the supporting member and includes a cutout formed at a portion corresponding to the gates, which are connected to each other through the cutout.

8 Claims, 4 Drawing Sheets

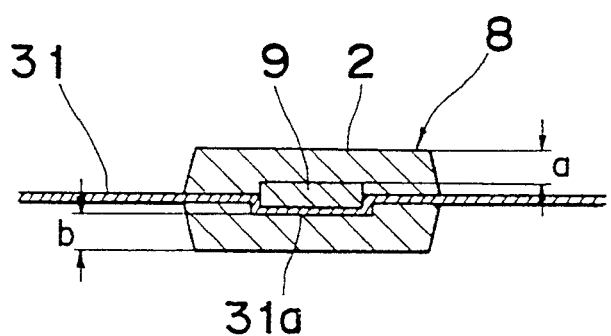
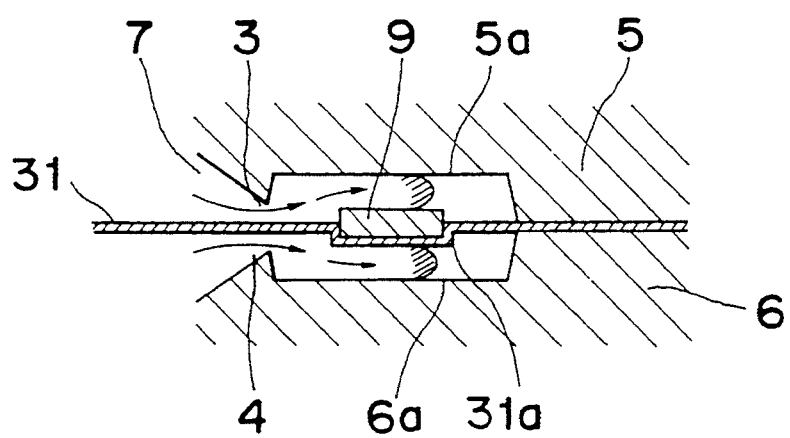

MOLD TOOL ASSEMBLY

This application is a continuation-in-part of now abandoned application Ser. No. 07/841,764, filed on Feb. 28, 1992, which application is a division of now abandoned application Ser. No. 07/561,907, filed on Jul. 31, 1990.

BACKGROUND OF THE INVENTION

The present invention relates to a mold tool for forming an electronic component having a semiconductor chip sealed on a substrate by resin, a method for forming the electronic component, and a lead frame on which a semiconductor chip can be put and thereafter the chip on the frame is sealed by resin.

Referring to FIGS. 6–8, a known semiconductor sealing method will be described hereinafter. FIG. 6 is a schematic cross-sectional view of a known resin-molded electronic component 21 and FIGS. 7 and 8 show example phenomena caused by molding in the known semiconductor sealing method.

In FIG. 6, a substrate 23 for attaching a semiconductor 22 is flat. The chip 22 is sealed on the substrate 23 by resin, resulting in a difference between the distance (c) from the upper surface of the chip 22 to the upper surface of a sealing portion 27 and the distance (d) from the lower surface of the substrate 23 to the lower surface of the sealing portion 27.

However, since the configuration elements such as the sectional area and the thickness of the molded product have a great effect on the flow of the molten resin, the above construction causes the resin to firstly flow in the lower mold having a cavity with a larger depth than the depth of the upper mold as shown in FIG. 7 and then flow to the upper mold after the lower cavity of the lower mold is filled with resin. As a result thereof, the resin flow forces gas in the cavities to be held in the upper mold having the cavity with the smaller depth, forming voids in the upper cavity, thus causing disadvantages such as poor insulation properties of the product. As shown in FIG. 8, if the substrate 23 is easily deformed, the substrate 23 is easily deformed by the resin flow. The forward ends 28a and 28b of the two resin flows entering the upper and lower cavities after passing through a gate 24 are difficult to coincide with each other. Therefore, after the lower cavity is filled with the resin, the pressure caused in the lower cavity by the resin is applied to the substrate 23 to deform, resulting in a poor quality of the electronic component molded by resin.

SUMMARY OF THE INVENTION

Accordingly, an essential object of the present invention is to provide a mold tool and a method for forming an electronic component having a semiconductor chip sealed on a supporting member by resin, and a lead frame, which are capable of preventing poor quality of the formed electronic component.

Another important object of the present invention is to provide a lead frame capable of preventing deformation and crack of a sealing portion molded by resin.

In accomplishing these and other objects, according to one aspect of the present invention, there is provided a mold tool for forming an electronic component having a semiconductor chip sealed on a supporting member, such as a substrate or a lead frame, by a resin-molded package, comprising, an upper mold having an upper cavity, a lower mold having a lower cavity, the package being molded in the cavities, and upper and lower gates respectively arranged at opposing surfaces of the molds and symmetrically formed with respect to a parting face of the mold tool to connect with the cavities.

By the above construction of the present invention, the upper and lower gates are arranged at the opposing surfaces of the upper and lower molds symmetrically with respect to the parting face of the mold tool, and the forward ends of the resin flows are certainly coincided with each other. Thus, the tool can prevent the supporting member from deforming because a biased pressure on the supporting member is not formed in the cavities, and the quality of the formed electronic component is improved.

According to another aspect of the present invention, there is provided a method for forming an electronic component having a semiconductor chip sealed on a supporting member, such as a substrate or a lead frame, by a resin-molded package, comprising the steps of inserting the supporting member with the chip in cavities of upper and lower molds of a mold tool, the molds having upper and lower gates respectively arranged at opposing surfaces of the molds and symmetrically formed with respect to a parting face of the mold tool to connect with the cavities, clamping the molds, injecting molten resin into the cavities of the clamped molds through the upper and lower gates, cooling the molten resin in the cavities, and separating the molds from each other and removing the component from the cavities.

By the above method of the present invention, the resin flows in the upper cavity in the mold in the upper direction passing through the upper gate while the resin flows in the lower cavity in the mold in the lower direction passing through the lower gate, and the resin flows in the two directions are symmetrical with respect to the parting face of the mold tool. Therefore, the forward ends of the resin flows are certainly coincided with each other. Thus, the method can prevent the supporting member from deforming because a biased pressure on the supporting member is not formed in the cavities, and the quality of the formed electronic component is improved.

According to still another aspect of the present invention, there is provided an electronic component formed by the method, comprising a semiconductor chip, a supporting member, such as a substrate or a lead frame, on which the chip is put, and a resin-molded package attached to the supporting member, in which the chip is sealed by resin.

According to a further aspect of the present invention, there is provided an electronic component formed by the method, wherein the supporting member has a recess where the chip is located, and the recess has such a depth that a distance between an upper surface of the chip located in the recess and an upper surface of the package is substantially equal to a distance between a lower surface of a portion where the recess is formed and a lower surface of the package.

According to a still further aspect of the present invention, there is provided an electronic component comprising a semiconductor chip, a supporting member, such as a substrate or a lead frame, on which the chip is put, and a resin-molded package attached to the supporting member, in which the chip is sealed by resin. The supporting member has a recess at a portion where the chip is located, and the recess has a depth such that a distance between an upper surface of the chip located in the recess and an upper surface of the package is substantially equal to a distance between a lower surface of a portion where the recess is formed and a lower surface of the package.

By the above construction of the above aspects of the present invention, the supporting member has the recess, thus the distance between the upper surface of the chip and the upper surface of the cavity in the upper mold is substantially equal to the distance between the lower surface of a portion where the recess is formed and the lower surface of the cavity in the lower mold, and additionally, the gates are arranged at the opposing surfaces of the molds symmetrically with respect to the parting face of the mold tool. Therefore, the forward ends of the resin flow flowing in the upper and lower molds can be more effectively coincided with each other to prevent the formation of voids due to remaining gas in one of the molds and any deformation of the supporting member by the biased pressure. Then it cannot cause disadvantageous insulation properties in the product, resulting in excellent quality of the electronic component.

According to another aspect of the present invention, there is provided a lead frame on which a semiconductor chip is put and then the chip is sealed with resin in a mold tool including an upper mold and a lower mold which have upper and lower cavities and upper and lower gates arranged at opposing surfaces of the molds and symmetrically formed with respect to a parting face of the mold tool to connect with the cavities, the frame comprising a cutout formed at a portion corresponding to the gates, which are connected to each other through the cutout.

By the above construction of the aspect of the present invention, the cutout is formed at the position corresponding to the gates of the frame. Therefore, the molten resin flows in the upper cavity of the upper mold through the upper gate and the lower cavity of the lower mold through the lower gate so as to seal the chip to form the package. After completion of the sealing of the chip and the cure of the molten resin in the molds, the frame is not put between the remaining resins left at the gates, thus easily removing the remaining resins from the frame while ensuring the prevention of any deformation and crack of the package, and thus improving the quality and the productivity of the product.

According to another aspect of the present invention, there is provided a lead frame for mounting a semiconductor chip, whereat the chip is sealed with resin in a mold tool, including an upper mold and a lower mold which have upper and lower cavities and upper and lower gates arranged at opposing surfaces of the molds and which are symmetrically formed with respect to a parting face of the mold tool to connect with the cavities. In addition to a cut-out being formed at a portion corresponding to the gates, a runner for delivering molten resin to the gates is provided so as to extend only on one of the upper and lower sides of the lead frame, and not both sides of the lead frame.

By the above construction, the molten resin flows into the upper and lower cavities of the upper and lower molds through the respective upper and lower gates from the runner, but due to the runner extending either above or below the frame, after completion of the sealing of the chip and curing of the molten resin in the upper and lower molds, the lead frame is not placed between the remaining resins left near the gates of the cavities. Thus, the remaining resins may be easily removed from the lead frame while ensuring the prevention of any deformations or cracks of the package formed. Thus, the quality and productivity of the final product is improved.

BRIEF DESCRIPTION OF THE DRAWINGS

The above and other objects and features of the present invention will become clear from the following description taken in conjunction with the preferred embodiments thereof with reference to the accompanying drawings, in which:

FIG. 4 is a cross-sectional view of a resin-molded electronic component formed in a mold tool according to another embodiment of the present invention;

FIG. 5 is a cross-sectional view showing the phenomenon in the mold tool in a method according to the invention;

DETAILED DESCRIPTION OF THE EMBODIMENTS

Figure 1:
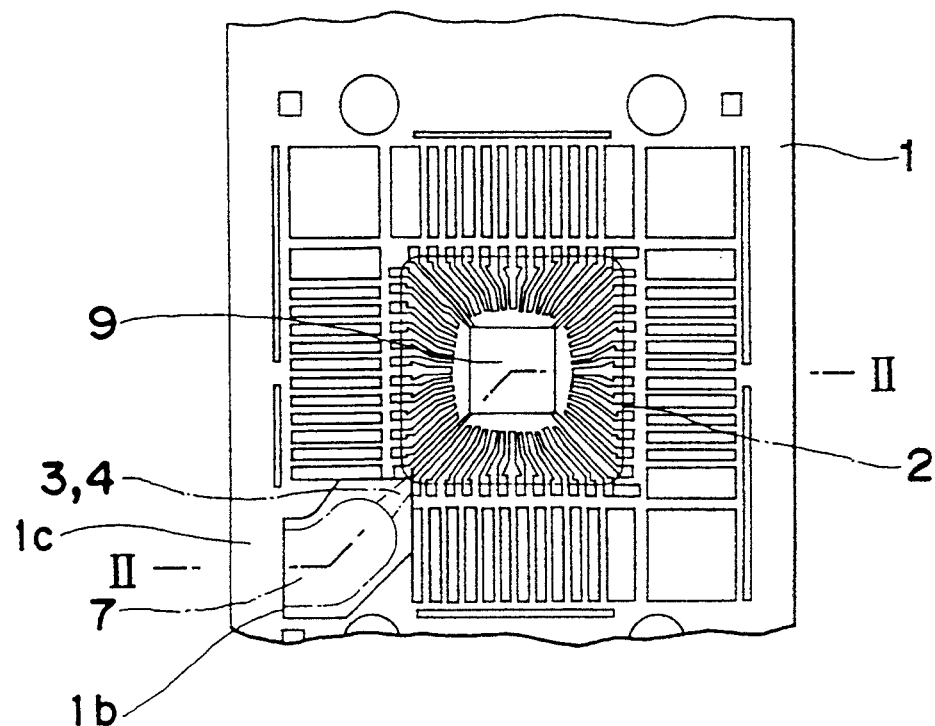
FIG. 1 is a plan view of a lead frame according to one embodiment of the present invention.

Before the description of the present invention proceeds, it is to be noted that like parts are designated by like reference numerals throughout the accompanying drawings.

Figure 2:
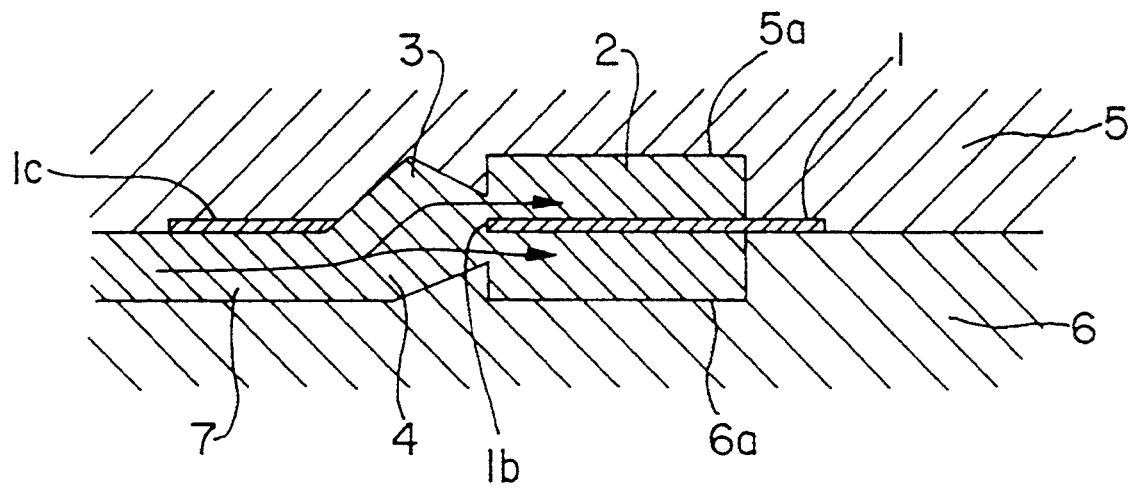
FIG. 2 is a sectional view taken along line II—II of FIG. 1.

FIG. 1 is a plan view of a lead frame 1, on which a Quad-Flat-Package-type semiconductor chip 9 is located, of one embodiment of the present invention, and FIG. 2 is a cross-sectional view taken along the line II—II of FIG. 1 and shows a mold tool according to an embodiment of the present invention.

In FIG. 1, reference numeral 1 denotes the lead frame, 2a resin-molded square package, 5 and 6 upper and lower molds having cavities 5a and 6a for molding the package 2, 3 and 4 upper and lower gates for flowing molten resin into the molds 5 and 6, 7 a runner connecting with the gates 3 and 4, and 1b a vacant cutout portion of the frame 1 formed at a portion contacting the gates 3 and 4 with each other. In FIG. 1, the runner 7 and the gates 3 and 4 are indicated by the imaginary lines to show the locations with respect to the frame 1, and the package 2 is indicated by the imaginary line to show the location with respect to the frame 1. The cutout 1b is elongated from one corner of the square package 2 molded at a central region of the lead frame 1 on a Quad-Flat-Package-type semiconductor chip 9 to seal the chip 9 to the remaining portion 1c of FIG. 1. There is no lead at the corner of the package 2 in the Quad-Flat-Package-type semiconductor chip 9, thus advantageously forming the cutout 1b. The remaining portion 1c is left on the frame 1 to strengthen the frame 1. The runner 7 and the gates 3 and 4 are located at the cutout 1b of the frame 1 and the gates 3 and 4 are connected with the cutout 1b of the frame 1.

The runner 7 is arranged on one of the upper and lower side of the frame to connect with the gates 3 and 4. Then, in molding after the molds 5 and 6 are clamped to each other while the chip 9 on the frame 1 is inserted into the cavities 5a and 6a, molten resin flows through the runner 7 in the gates 3 and 4 and further flows in the cavities 5a and 6a of the molds 5 and 6 through the gates 3 and 4, as shown in FIG. 2. Since the gates 3 and 4 are arranged at the opposing surfaces of the upper and lower molds 5 and 6 symmetrically with respect to the parting face of the mold tool, the resin flows in the upper and lower cavities 5a and 6a of the molds 5 and 6 through the upper and lower gates 3 and 4 substantially equally. After cooling the molten resin in the cavities 5a and 6a, the molds 5 and 6 are separated from each other to remove the component therefrom. As required, the remaining portion 1c can be cut away from the frame 1, so that the cutout 1b is elongated from the corner of the package 2 to the side edge of the frame 1 in a direction perpendicularly to a longitudinal direction of the frame 1.

According to the construction of the mold tool of the embodiment of the present invention, the upper and lower gates 3 and 4 are arranged at the opposing surfaces of the upper and lower molds 5 and 6 symmetrically with respect to the parting face of the mold tool and, the forward ends of the resin flows are certainly coincided with each other. Thus, the tool can prevent the frame 1 from deforming because a biased pressure does not appear in the cavities 5a and 6a, and thus improves the quality of the formed electronic component. According to the method for forming the component according to the embodiment of the present invention, the resin flows in the upper cavity 5a in the mold 5 in the upper direction passing through the upper gate 3 while the resin flows in the lower cavity 6a in the mold 6 in the lower direction passing through the lower gate 4, and the resin flows in the two directions are symmetrical with respect to the parting face of the mold tool. Therefore, the forward ends of the resin flows are certainly coincided with each other. Thus, the method can prevent the frame 1 from deforming because a biased pressure, applied to the frame 1, does not appear in the cavities 5a and 6a, and, improves the quality of the formed electronic component. Additionally, according to the frame of the embodiment of the present invention, the cutout 1b is formed at a position corresponding to the gates 3 and 4 of the frame 1. Therefore, the molten resin flows in the upper cavity 5a of the upper mold 5 through the upper gate 3 and the lower cavity 6a of the lower mold 6 through the lower gate 4 so as to seal the chip 9 to form the package 2. After completion of the sealing of the chip 9 and the cure of the molten resin in the molds 5 and 6, since the frame is not put between the remaining resins left at the gates 3 and 4, the remaining resins from the frame 1, are thus easily removed, while ensuring the prevention of any deformation and crack of the package 2.

Figure 3A:
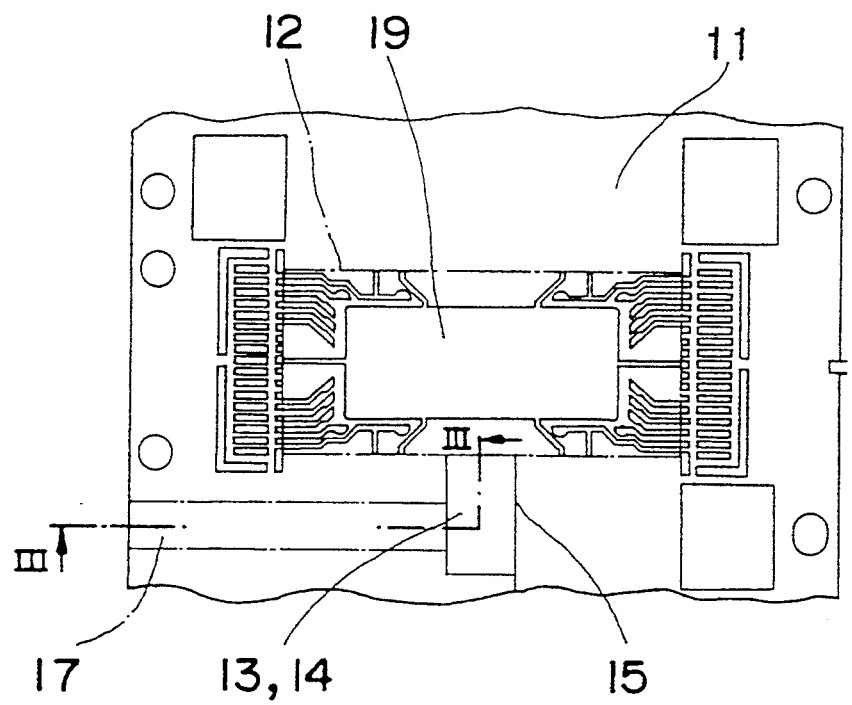
FIG. 3A is a plan view of a lead frame according to a modification of the first embodiment of the present invention.
Figure 3B:
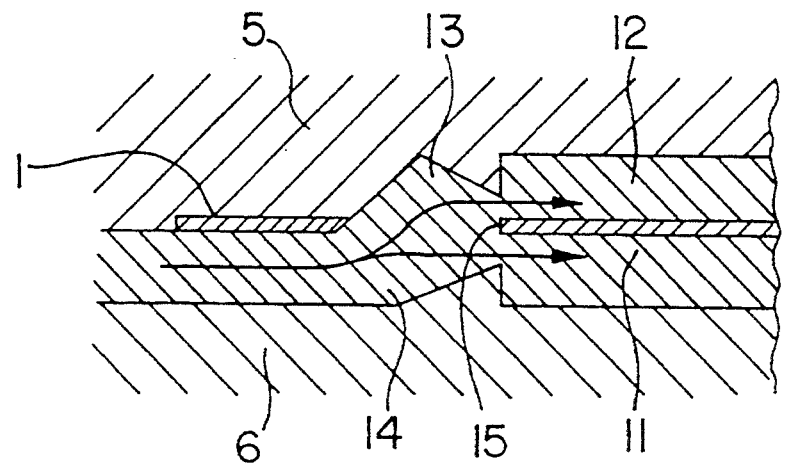
FIG. 3B is a sectional view taken along line III—III of FIG. 3A.
Figure 6:
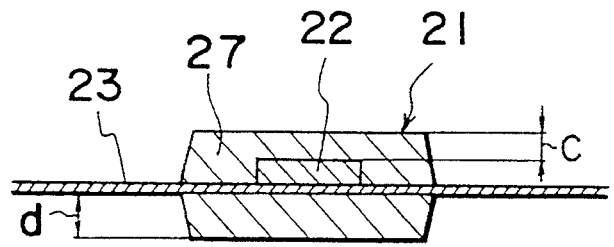
FIG. 6 is a cross-sectional view of a known resin-molded electronic component.
Figure 7:
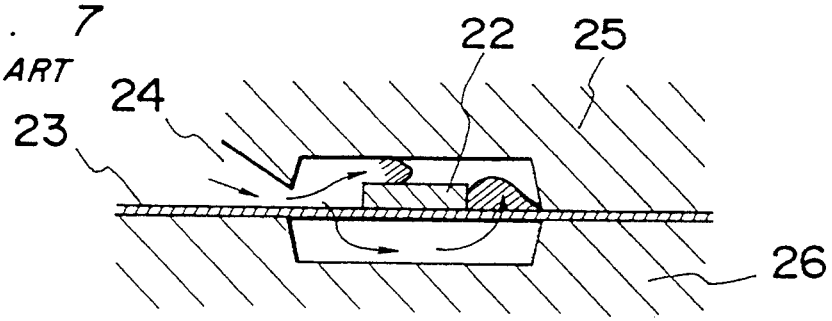
FIGS. 7 and 8 are cross-sectional views showing phenomena as examples in a process in which a semiconductor chip is sealed by resin.
Figure 8:
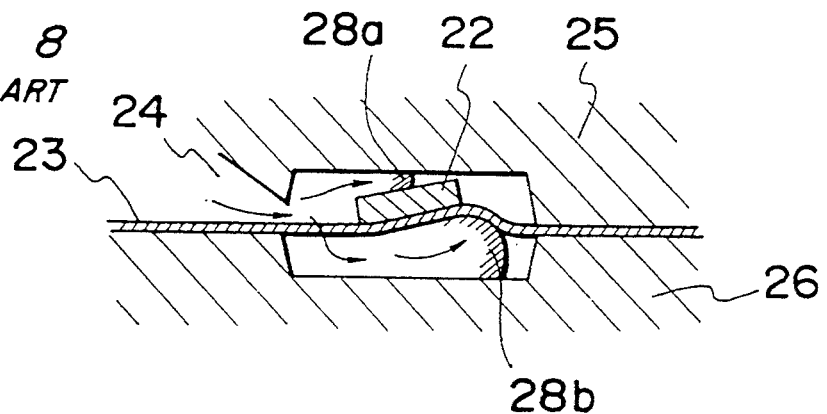

Next, FIG. 3 is a plan view of a lead frame, on which a Dual-Inline-Package-type semiconductor chip is located, according to a modification of the above embodiment of the present invention.

In FIG. 3, reference numeral 11 denotes the lead frame, 12 a resin-molded rectangular package, 13 and 14 upper and lower gates for flowing molten resin in cavities of molds (not shown, but similar to the molds 5 and 6 in FIG. 2), 15 a rectangular cutout of the frame 11 formed at a portion contacting the gates 13 and 14 with each other and located at the middle of the frame 11 in a direction perpendicular to the longitudinal direction of the frame 11, and 17 a runner connecting with the gates 13 and 14. In FIG. 3, the runner 17 is indicated by an imaginary line to show the location with respect to the frame 11 and the location of the gates 13 and 14 coincides with the cutout 15. Additionally, in FIG. 3, the package 12 is also indicated by an imaginary line to show the location with respect to the frame 11. The cutout 15 is located at the portion corresponding to the side of the package 12 molded on the semiconductor chip 19. There is no lead at the side of the package 12 in the Dual-Inline-Package-type semiconductor chip 19, thus advantageously forming the cutout 15. The runner 17 is arranged on one of the upper and lower sides of the frame 11 to connect with the gates 13 and 14. Then, in molding after the molds 15 and 16 are clamped to each other while the chip 19 on the frame 11 is inserted into the cavities, molten resin flows through the runner 17 in to the gates 13 and 14 and further flows in to the cavities of the molds (not shown) through the gates 13 and 14. Since the gates 13 and 14 are arranged symmetrically to the upper and lower molds, the resin flows in the upper and lower cavities substantially equally. After cooling the molten resin in the cavities, the molds are separated from each other to remove the component therefrom. As required, the cutout 15 can be elongated from the side of the package 12 to the side edge of the frame 11 in a direction perpendicularly to a longitudinal direction of the frame 11 to coincide with the runner 17.

According to the frame 11 according to the modification of the embodiment, the cutout 15 is formed at a position corresponding to the gates 13 and 14 of the frame 11. Therefore, the molten resin flows in the cavities of the molds through the runner 17 and the gates 13 and 14 to seal the chip 19 to form the package 12. After completion of the sealing of the chip 19 and the cure of the molten resin in the molds since, the frame 11 is not put between the remaining resins left at the gates 13 and 14, the remaining resins from the frame 11 are easily removed while ensuring the prevention of any deformation and crack of the package 12.

FIG. 4 is a cross-sectional view of a resin-molded electronic component according to another embodiment of the present invention and FIG. 5 is a schematic view showing a semiconductor sealing method according to still another embodiment of the present invention. In FIG. 4, reference numeral 31 denotes a supporting member for supporting the chip 9, such as a lead frame or a substrate, and 8 denotes the electronic component. The substrate 31 has a recess 31a with the same shape as the contact surface of the chip 9 at a portion where the chip 9 is located, so that the distance (a) from the upper surface of the chip 9 to the upper surface of the package 2 is substantially equal to the distance (b) from the lower surface of the portion where the recess 31a is formed to the lower surface of the package 2.

Therefore, after the molds 5 and 6 are clamped to each other while the substrate 1 with the chip 9 is inserted into the cavities 5a and 6a, molten resin flows in to the gates 3 and 4 through the upper and lower runners 7 arranged over and under the substrate 31, and further flows in the cavities 5a and 6a of the molds 5 and 6 through the gates 3 and 4. As described above, the gates 3 and 4 are arranged at the opposing surfaces of the upper and lower molds 5 and 6 symmetrically with respect to the parting face of the mold tool and the distance (a) from the upper surface of the chip 9 to the upper surface of the package 2, that is, the upper surface of the upper cavity 5a of the upper mold 5, is substantially equal to the distance (b) from the lower surface of the portion where the recess 31a is formed to the lower surface of the package 2, that is, the lower surface of the lower cavity 6a of the lower mold 6. Therefore, the resin flows in the upper and lower cavities 5a and 6a of the molds 5 and 6 substantially equally. After cooling the molten resin in the cavities 5a and 6a, the molds 5 and 6 are separated from each other to remove the component 8 therefrom.

According to the above construction, the substrate 31 has the recess 31a, and thus the distance (a) between the upper surface of the chip 7 and the upper surface of the cavity 5a in the upper mold 5 is substantially equal to the distance (b) between the lower surface of the portion where the recess 31a is formed and the lower surface of the cavity 6a in the lower mold 6, and additionally, the gates 3 and 4 are arranged at the opposing surfaces of the molds 5 and 6 symmetrically with respect to the parting face of the mold tool. Therefore, the forward ends of the resin flow flowing in the upper and lower molds 5 and 6 can be certainly coincided with each other to prevent the formation of voids due to remaining gas in one of the molds 5 and 6 and any deformation of the substrate 1 by a biased pressure. Then, the embodiment can not cause disadvantageous insulation properties in the product, resulting in excellent quality of the electronic component 8.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A molding arrangement for forming an electronic component, comprising:
   a mold tool having an upper mold and a lower mold defining respective upper and lower cavities and upper and lower gates arranged symmetrically with respect to a parting face between said upper and lower molds at opposite surfaces of said upper and lower molds, said gates connecting directly with said cavities; and
   a lead frame for supporting a semiconductor chip in said mold tool for sealing the chip with resin, said lead frame having upper and lower sides and a vacant cutout portion therein at a position corresponding to said gates, wherein said gates are connected to each other through said vacant cutout portion;
   wherein said mold tool further comprises a runner connected to said gates for providing molten resin thereto, said runner being disposed on only one of said upper and said lower sides of said lead frame.

2. The molding arrangement of claim 1, wherein said lead frame has a central rectangular portion for a rectangular semiconductor chip, said vacant cutout portion being located at one corner of said central rectangular portion.

3. The molding arrangement of claim 2, wherein said vacant cutout portion extends from the one corner of said central rectangular region towards a side edge of said lead frame in a direction angled relative to the longitudinal direction of said central rectangular region.

4. The molding arrangement of claim 1, wherein said lead frame has a portion thereof defining sides of said vacant cutout portion, said runner extending only one of below and above said portion of said lead frame to said vacant cutout portion and said gates.

5. The molding arrangement of claim 1, wherein said gates are located between said runner and said cavities such that no leads of said lead frame extend between said gates.

6. A molding arrangement for forming an electronic component, comprising:
   a mold tool comprising an upper mold and a lower mold defining respective upper and lower cavities and upper and lower gates arranged symmetrically with respect to a parting face therebetween, said upper cavity being disposed opposite said lower cavity and said upper gate being disposed opposite said lower gate, said upper and lower gates communicating with said upper and lower cavities, respectively;
   a lead frame in said mold tool between said upper and lower molds, said lead frame having upper and lower sides and a vacant portion therein at said gates such that said gates are directly connected to each other through said vacant portion of said lead frame; and
   a runner defined in only one of said upper and lower molds and connected to the respective said gate of said mold for providing molten resin thereto such that said runner is defined on only one of said upper and lower sides of said lead frame and said gates directly fluidly connect said cavities to said runner.

7. The molding arrangement of claim 6, wherein said upper and lower molds have said parting face therebetween, and said upper and lower gates comprise sloping surfaces on said upper and lower molds, respectively, that slope towards said parting face with said vacant portion therebetween.

8. The molding arrangement of claim 7, wherein said sloping surfaces slope to a point at which said gates meet said cavities.

* * * * *

UNITED STATES PATENT AND TRADEMARK OFFICE
CERTIFICATE OF CORRECTION

PATENT NO. : 5,349,136
DATED : September 20, 1994
INVENTOR(S) : Mitsuhiro ABE et al.

It is certified that error appears in the above-identified patent and that said Letters Patent is hereby corrected as shown below:

Cover page, under "[75] Inventors:" change "Nakanishi Itsuto" to --Itsuto Nakanishi--, and change "Ariyoshi Hideho" to --Hideho Ariyoshi--.

Signed and Sealed this

Eighteenth Day of July, 1995

Attest:

BRUCE LEHMAN

Attesting Officer

Commissioner of Patents and Trademarks